United States Patent
Shi et al.

(10) Patent No.: US 7,187,186 B2
(45) Date of Patent: Mar. 6, 2007

(54) METHODS AND SYSTEMS FOR DETERMINING ONE OR MORE PROPERTIES OF A SPECIMEN

(75) Inventors: Jianou Shi, Milpitas, CA (US); Jeffrey Rzepiela, Sunnyvale, CA (US); Shiyou Pei, Saratoga, CA (US); Zhiwei Xu, Sunnyvale, CA (US); John Alexander, Gilbert, AZ (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 0 days.

(21) Appl. No.: 11/078,669

(22) Filed: Mar. 10, 2005

(65) Prior Publication Data

US 2005/0206402 A1    Sep. 22, 2005

Related U.S. Application Data

(60) Provisional application No. 60/555,172, filed on Mar. 22, 2004.

(51) Int. Cl.
*G01R 31/302* (2006.01)

(52) U.S. Cl. .................................................. 324/752

(58) Field of Classification Search ............... 324/754, 324/752, 765, 158.1, 766; 250/214 R–215, 250/306–307, 310–311, 492.21; 356/30, 356/600, 401
See application file for complete search history.

(56) References Cited

U.S. PATENT DOCUMENTS

| | | | |
|---|---|---|---|
| 4,333,051 A * | 6/1982 | Goodman | 324/752 |
| 4,454,472 A * | 6/1984 | Moore | 324/765 |
| 5,025,145 A | 6/1991 | Lagowski | |
| 5,663,657 A * | 9/1997 | Lagowski et al. | 324/766 |
| 6,366,104 B2 | 4/2002 | Heal et al. | |
| 6,445,199 B1 | 9/2002 | Satya et al. | |
| 6,512,384 B1 * | 1/2003 | Lagowski et al. | 324/752 |
| 6,531,774 B1 | 3/2003 | Do et al. | |
| 6,538,454 B1 | 3/2003 | Frenkel et al. | |
| 6,563,299 B1 | 5/2003 | Van Horn et al. | |
| 6,614,227 B2 | 9/2003 | Ookubo | |
| 6,642,726 B2 | 11/2003 | Weiner et al. | |

OTHER PUBLICATIONS

Schroder, "Surface voltage and surface photovoltage: history, theory and applications," Measurement Science and Technology, vol. 12, 2001, pp. R16-31.

* cited by examiner

*Primary Examiner*—Ha Tran Nguyen
*Assistant Examiner*—Tung X Nguyen
(74) *Attorney, Agent, or Firm*—Baker & McKenzie LLP (57) ABSTRACT

Various methods and systems for determining one or more properties of a specimen are provided. One system for determining a property of a specimen is configured to illuminate a specimen with different wavelengths of light substantially simultaneously. The different wavelengths of light are modulated at substantially the same frequency. The system is also configured to perform at least two measurements on the specimen. A minority carrier diffusion length of the specimen may be determined from the measurements and absorption coefficients of the specimen at the different wavelengths. Another system for detecting defects on a specimen is configured to deposit a charge at multiple locations on an upper surface of the specimen. This system is also configured to measure a vibration of a probe at the multiple locations. Defects may be detected on the specimen using a two-dimensional map of the specimen generated from the measured surface voltages.

17 Claims, 4 Drawing Sheets

METHODS AND SYSTEMS FOR DETERMINING ONE OR MORE PROPERTIES OF A SPECIMEN

PRIORITY CLAIM

This application claims priority to U.S. Provisional Application No. 60/555,172 entitled "Methods and Systems for Determining One or More Properties of a Specimen," filed Mar. 22, 2004, which is incorporated by reference as if fully set forth herein.

BACKGROUND OF THE INVENTION

1. Field of the Invention

The present invention generally relates to methods and systems for determining one or more properties of a specimen. Certain embodiments relate to methods and systems for determining a minority carrier diffusion length and contamination levels of a specimen. Other embodiments relate to methods and systems for detecting defects on a specimen.

2. Description of the Related Art

Methods and systems are currently available for the measurement of minority carrier lifetimes in semiconductor wafers. The minority carrier lifetimes of semiconductor wafers is of interest to semiconductor manufacturers since the minority carrier lifetimes indicate the degree of contamination in the wafers. For example, the minority carrier lifetimes are inversely related to the degree of contamination in the wafers. In particular, as described in U.S. Pat. No. 6,512,384 to Lagowski et al., which is incorporated by reference as if fully set forth herein, the minority carrier diffusion length, L, is the effective distance that excess minority carriers diffuse into a semiconductor during their lifetime. The value of the minority carrier diffusion length is used as an indicator of the purity of semiconductor materials. L gives a measure of the contaminant concentration in the semiconductor because heavy metals function as recombination centers which reduce the minority carrier lifetime. As a result, higher concentrations of contaminants decrease the minority carrier diffusion lengths.

Typically, the diffusion length in silicon wafers is measured at various stages of fabrication of microelectronic chips or "integrated circuits" to measure the concentration of potentially harmful impurities, which may have been inadvertently introduced into the wafer. Frequent monitoring of the minority carrier diffusion lengths helps to identify when a given process or a given tool starts to contaminate wafers above a permissible level. Preventive maintenance of processing equipment or replacement of chemicals done at this stage helps to reduce the possibility of large scale manufacturing losses.

In the past, methods for measuring minority carrier lifetimes of semiconductor wafers have used illumination of the wafers with several wavelengths and detection of the resulting surface photo voltage (SPV) signal, which can then be used to determine minority carrier diffusion lengths. The term "surface photo voltage" is generally defined as a reduction of the surface space charge width during illumination and its recovery in the dark. One example of such a method is illustrated in U.S. Pat. No. 4,333,051 to Goodman, which is incorporated by reference as if fully set forth herein. Goodman uses a broadband light source coupled to a monochromator to illuminate a wafer. The wafer is illuminated with light of different wavelengths sequentially. At each wavelength (corresponding to a different absorption coefficient, $\alpha$), the photon flux ($\Phi$) is adjusted to achieve the same SPV signal. Modulation of the light source is achieved using a chopper wheel. The diffusion length is determined from a plot of $\Phi$ vs. $1/\alpha$. Another method was initially developed by Quilliet and one example of a similar method is illustrated in U.S. Pat. No. 5,025,145 to Lagowski, which is incorporated by reference as if fully set forth herein. Quilliet used a broadband light source and monochromator to illuminate a wafer at different wavelengths. In contrast, Lagowski uses a broadband light source and bandpass filters to illuminate a wafer at different wavelengths. Each method maintains a constant photon flux and measures the SPV at different selected wavelengths sequentially. Modulation is achieved using a chopper wheel. In another example illustrated in U.S. Pat. No. 5,663,657 to Lagowski et al., which is incorporated by reference as if fully set forth herein, Lagowski et al. introduced modifications to the voltage probe design, corrections for wafer reflectivity, and corrections for long diffusion lengths (greater than wafer thickness). In a newer version of the constant photon method illustrated in U.S. Pat. No. 6,512,384 to Lagowski et al., Lagowski et al. uses two wavelengths modulated at two different frequencies to perform the constant photon flux determination of diffusion lengths by illuminating the wafer with both wavelengths simultaneously. The first wavelength of light is provided by a broadband light source coupled to a bandpass filter. The second wavelength of light is provided by an infrared light emitting diode (IR LED) coupled to a bandpass filter.

The above described methods and systems, however, have several disadvantages. For example, the systems described in U.S. Pat. No. 4,333,051 to Goodman have the disadvantage that the photon flux has to be adjusted at each wavelength to achieve the same SPV signal. Even using a servo to achieve this adjustment, there is a throughput disadvantage due to the time required to measure the SPV signal and adjust the flux accordingly. The systems described in U.S. Pat. No. 5,025,145 to Lagowski and U.S. Pat. No. 5,663,657 to Lagowski et al. have the disadvantage that the wavelengths are sent to the wafer sequentially. This configuration results in a throughput loss, as the same measurement site has to be sequentially illuminated with each wavelength. There is also a possibility that characteristics of the wafer will change on the time scale it takes to change among the wavelengths. For example, as described by Lagowski et al. in U.S. Pat. No. 6,512,384, the delay, typically 6 seconds, between sequentially measuring the first and second SPV results in changes in the surface condition of the wafer, e.g., static charge created by wafer motion, surface relaxation after previous chemical treatments, and adsorption or desorption caused by ambient changes. These changes alter the SPV signal value and thereby create errors in diffusion length measurements. The systems described in U.S. Pat. No. 6,512,384 address the throughput concern by simultaneously illuminating a wafer with two different wavelengths of light. However, these systems have the disadvantage that the wavelengths are modulated at two different frequencies. This modulation scheme requires the demodulation of the resulting ac-SPV signal at two reference frequencies. Also, SPV amplitudes tend to decrease with increasing modulation frequency. This frequency dependence requires the use of one of two correction procedures shown in U.S. Pat. No. 6,512,384 to normalize the measured SPV signals to a single modulation frequency.

Accordingly, it may be desirable to develop systems and methods for determining a property of a specimen such as the minority carrier lifetime or minority carrier diffusion length which have relatively high throughput, relatively good accuracy, and relative simplicity of design.

Inspection of specimens such as wafers is typically performed at various stages of a semiconductor fabrication process. Inspection is performed to detect defects such as electrical defects and/or any number of other types of defects, which may have been inadvertently formed on the wafer, some of which may adversely affect the performance of integrated circuits that are eventually formed on the wafer. Frequent inspection of wafers helps to identify when a given process or a given tool is causing defects on wafers. Preventive maintenance of processing equipment or replacement of chemicals done at this stage may help to reduce the possibility of large scale manufacturing losses due to the defects.

Electrical defects are of particular interest to those involved in integrated circuit manufacturing since integrated circuits are inherently electrical by nature. Many different methods and systems have been developed to inspect wafers for electrical defects. Examples of attractive methods and systems for electrical defect inspection are illustrated in U.S. Pat. No. 6,445,199 to Satya et al. and U.S. Pat. No. 6,642,726 to Weiner et al., both of which are incorporated by reference as if fully set forth herein. One method described by Satya et al. includes illuminating a sample with a charged particle beam thereby causing voltage contrast within structures present on the sample. The sample may be illuminated using a scanning electron microscope system. In the voltage contrast mode, the scanning electron microscope can be used to distinguish charge floating conductor shapes from charge-drained grounded shapes in terms of visual or intensity contrasts in the voltage contrast data. Position data concerning the location of electrical defects may also be determined from the voltage contrast information.

In one method described by Weiner et al., a test structure is designed to include a plurality of features that will charge to specific voltage potentials when scanned with an electron beam during a voltage contrast inspection. Images of the scanned features are generated, and the relative brightness level of each feature depends on the corresponding potential of each feature during the inspection. That is, some features are expected to appear dark, and other features are expected to appear bright. If there is no defect present in the scanned feature, the corresponding image will have the expected number of bright and dark features. However, if there is a defect present, the number of dark and bright features within the generated image will not match expected results.

Although the methods and systems described by Satya et al. and Weiner et al. have proven to be extremely useful for detection of electrical defects, particularly in comparison to other electrical defect inspection methods and systems, certain aspects of these voltage contrast-based inspection methods and systems allow room for improvement. For example, since these methods and systems use a charged particle beam for inspection, inspection must be carried out in a vacuum environment. Performing inspection in a vacuum environment is more expensive and slower than performing inspection in an ambient environment. In addition, the electrical defect inspection methods and systems are generally designed for inspection using only one type of charged particle (e.g., electrons). Therefore, the data that can be generated by such inspection methods and systems may be somewhat limited, particularly for use in identification of defect types (i.e., classification).

Accordingly, it may be desirable to develop methods and systems for electrical defect inspection and classification that can be used in an ambient environment thereby reducing the cost and increasing the throughput of electrical defect inspection and that can generate more useful data than those methods and systems that are currently available for electrical defect inspection.

SUMMARY OF THE INVENTION

An embodiment of the invention relates to a system configured to determine a property of a specimen without contacting the specimen. The system includes two light sources that are configured to illuminate a measurement spot on the specimen with different wavelengths of light substantially simultaneously. The two light sources are modulated at substantially the same frequency. A first of the two light sources is also modulated 90° out of phase compared to a second of the two light sources. In some embodiments, the two light sources include lasers. For example, in one embodiment, the two light sources may include diode lasers. In such embodiments, the two light sources may be modulated by modulating drivers of the lasers. In another embodiment, the two light sources may be configured to illuminate the specimen with substantially constant illumination fluxes. In another embodiment, the two light sources may be coupled to a servo circuit that is configured to adjust one or more parameters of the light sources (e.g., laser intensities) to produce substantially the same (i.e., substantially equal) surface photo voltage (SPV) signals at the two wavelengths. The system also includes a probe that is configured to perform at least two measurements on the specimen. Each of the at least two measurements is generated by illumination of the specimen with one of the two light sources. The measurements may be surface photo voltage measurements or illumination flux measurements.

In addition, the system includes a processor configured to determine a minority carrier diffusion length of the specimen from the at least two measurements and absorption coefficients of the specimen at the different wavelengths. In one embodiment, the flux level of the two light sources is substantially the same. The processor may also be configured to generate a plot of an inverse of the two SPV measurements (1/SPV) vs. an inverse of the absorption coefficients ($1/\alpha$). In such an embodiment, the processor may also be configured to determine the minority carrier diffusion length from a linear fit to the plot. In another embodiment, the two light sources may be configured with a servo circuit to adjust the laser intensities to result in substantially the same SPV signals at the two wavelengths. In this embodiment, the processor may also be configured to generate a plot of illumination flux ($\Phi$) vs. an inverse of the absorption coefficients ($1/\alpha$). In such an embodiment, the processor may also be configured to determine the minority carrier diffusion length from a linear fit to the plot. In one embodiment, the processor may be configured to determine contamination levels in the specimen using the minority carrier diffusion length. In some embodiments, the system may be coupled to a process tool. Each of the embodiments of the system described above may be further configured as described herein.

Another embodiment relates to a method for determining a property of a specimen without contacting the specimen. The method includes illuminating a measurement spot on the specimen with two light beams substantially simultaneously. The two light beams have different wavelengths. In addition, the two light beams are modulated at the same frequency. A first of the two light beams is modulated 90° out of phase compared to a second of the two light beams. In some embodiments, the two light beams have substantially constant illumination fluxes. The method also includes performing at least two measurements on the specimen. Each of the at least two measurements is generated by illuminating the specimen with one of the two light beams. In another embodiment, two light sources configured to produce the two light beams may be coupled to a servo circuit that is configured to adjust one or more parameters of the light sources (e.g., laser intensities) such that the light beams produce substantially the same (i.e., substantially equal) SPV signals at the two wavelengths.

In addition, the method includes determining a minority carrier diffusion length of the specimen from the at least two measurements and absorption coefficients of the specimen at the different wavelengths. In one embodiment, where a flux level of the two light beams is substantially the same, determining the minority carrier diffusion length includes generating a plot of an inverse of the two SPV measurements (1/SPV) vs. an inverse of the absorption coefficients (1/α). Such an embodiment may also include determining the minority carrier diffusion length from a linear fit to the plot. In another embodiment, where the two light sources are configured to produce substantially the same SPV signals at the two wavelengths, determining the minority carrier diffusion length may include generating a plot of illumination flux (Φ) vs. an inverse of the absorption coefficients (1/α). In such an embodiment, the minority carrier diffusion length may then be determined from a linear fit to the plot. In some embodiments, the method may include determining contamination levels in the specimen using the minority carrier diffusion length. Each of the embodiments of the method described above may include any other steps described herein.

A different embodiment relates to a system configured to detect defects on a specimen. In one embodiment, the defects may include electrical defects. In some embodiments, the specimen may include a patterned wafer. However, the methods and systems described herein may also be used to detect other types of defects on these and other specimens.

The system includes a charge deposition subsystem that is configured to deposit a charge at multiple locations on an upper surface of the specimen. The system also includes a measurement subsystem configured to measure a vibration of a probe at the multiple locations after the charge has been deposited. In some embodiments, the measurement subsystem may be configured to measure the vibration at one of the multiple locations while the charge deposition subsystem is depositing a charge at another of the multiple locations.

In one embodiment, the probe may be a Kelvin probe coupled to a cantilever. In such an embodiment, the measurement subsystem may be configured to measure the vibration of the probe by optically measuring a position of the cantilever. In another embodiment, the probe may include multiple probes arranged in an array such that the multiple probes can be arranged above a plurality of the multiple locations substantially simultaneously. In one such embodiment, the measurement subsystem may be configured to measure a vibration of two or more of the multiple probes substantially simultaneously. In one embodiment, the probe may have a tip size of about 10 µm to about 1 nm. In addition, the system includes a processor that is configured to determine a surface voltage at the multiple locations from the vibration measurements.

The processor is also configured to generate a two-dimensional map of the specimen using the surface voltages at the multiple locations. The processor is further configured to detect defects on the specimen using the two-dimensional map. In some embodiments, the probe described above may be an inspection probe. In one such embodiment, the measurement subsystem may also be configured to measure a vibration of a review probe at locations of the defects. In this manner, the system may be configured for both inspection and review of defects. In one embodiment, the review probe may have a tip size that is smaller than a tip size of the inspection probe.

In some embodiments, the charge that is deposited on the specimen may be a first type of charge. The charge deposition subsystem may be configured to deposit a second type of charge at the multiple locations on the specimen such that another two-dimensional map of the specimen can be generated. Both or one of the two-dimensional maps may be used to detect defects on the specimen. Each of the embodiments of the system described above may be further configured as described herein.

An additional embodiment relates to a method for detecting defects on a specimen. The defects may include electrical defects. The defects, however, may include any other defects described herein. The specimen may include a patterned wafer or any other specimen described herein. The method includes depositing a charge at multiple locations on an upper surface of the specimen. The method also includes measuring a vibration of a probe at the multiple locations after the charge has been deposited. In one embodiment, measuring the vibration may be performed at one of the multiple locations while depositing the charge is performed at another of the multiple locations.

In another embodiment, the probe may include a Kelvin probe coupled to a cantilever. In one such embodiment, measuring the vibration of the probe may include optically measuring a position of the cantilever. In some embodiments, the probe may include multiple probes arranged in an array such that the multiple probes can be arranged above a plurality of the multiple locations substantially simultaneously. In one such embodiment, measuring the vibration may include measuring a vibration of two or more of the multiple probes substantially simultaneously.

In addition, the method includes determining a surface voltage at the multiple locations from the vibration measurements. The method further includes generating a two-dimensional map of the specimen using the surface voltages at the multiple locations. The method also includes detecting defects on the specimen using the two-dimensional map. In one embodiment, the probe described above may be an inspection probe. In one such embodiment, the method may include reviewing the defects by measuring a vibration of a review probe at locations of the defects. The review probe may have a tip size that is smaller than a tip size of the inspection probe.

In some embodiments, the charge deposited on the specimen is a first type of charge. In one such embodiment, the method may also include depositing a second type of charge at the multiple locations such that an additional two-dimensional map of the specimen can be generated. In such an embodiment, the defects may be detected on the specimen using the two-dimensional map and/or the additional two-dimensional map. Each of the embodiments of the method described above may include any other steps described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, a "specimen" is generally defined as a wafer or any other specimen known in the art. The term "wafer" generally refers to a substrate formed of a semiconductor or a non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include only a substrate. Such a wafer is commonly referred to as a "virgin wafer." Alternatively, a wafer may include one or more layers formed upon a semiconductor substrate. For example, such layers may include, but are not limited to, a resist, a dielectric material, and a conductive material. A resist may include a resist that may be patterned by an optical lithography technique, an e-beam lithography technique, or an X-ray lithography technique. Examples of a dielectric material include, but are not limited to, silicon dioxide, silicon nitride, silicon oxynitride, and titanium nitride. Additional examples of a dielectric material include "low-k" dielectric materials such as Black Diamond™ which is commercially available from Applied Materials, Inc., Santa Clara, Calif., CORAL™ commercially available from Novellus Systems, Inc., San Jose, Calif., "ultra-low k" dielectric materials such as "xero gels," and "high-k" dielectric materials such as tantalum pentoxide. In addition, examples of a conductive material include, but are not limited to, aluminum, polysilicon, and copper.

One or more layers formed on a wafer may be patterned or unpatterned. For example, a wafer may include a plurality of dies having repeatable pattern features. Formation and processing of such layers of material may ultimately result in completed semiconductor devices. As such, a wafer may include a substrate on which not all layers of a complete semiconductor device have been formed or a substrate on which all layers of a complete semiconductor device have been formed. The term "semiconductor device" is used interchangeably herein with the term "integrated circuit."

The specimen may further include at least a portion of a thin-film head die formed on a wafer, at least a portion of a micro-electro-mechanical system (MEMS) device formed on a wafer, flat panel displays, magnetic heads, magnetic and optical storage media, and at least a portion of other components that may include photonics and optoelectronic devices such as lasers, waveguides and other passive components processed on wafers, print heads, and bio-chip devices processed on wafers.

Turning now to the drawings, it is noted that FIGS. 1–2 and 4–6 are not drawn to scale. In particular, the scale of some of the elements of the figures is greatly exaggerated to emphasize characteristics of the elements. It is also noted that FIGS. 1–2 and 4–6 are not drawn to the same scale. Elements shown in more than one figure that may be similarly configured have been indicated using the same reference numerals.

Figure 1:
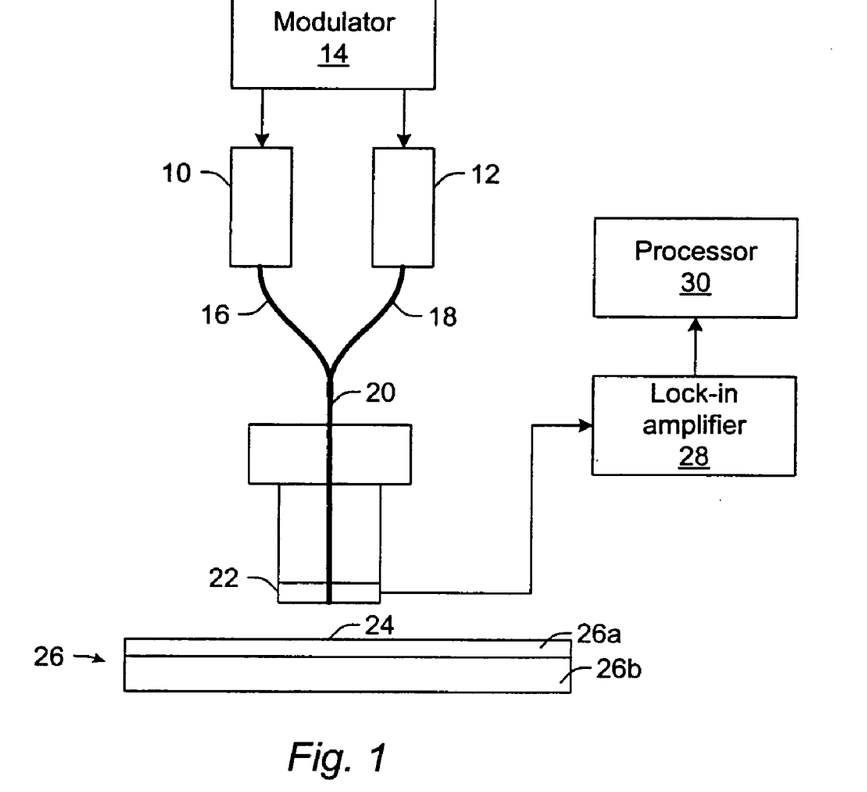
FIG. 1 is a schematic diagram illustrating a side view of one embodiment of a system configured to determine a property of a specimen without contacting the specimen.

FIG. 1 illustrates one embodiment of a system configured to determine a property of a specimen. The general purpose of the system (and methods) described herein is to monitor contamination levels in a specimen such as a wafer. For example, the systems and methods provide measurements of minority carrier diffusion lengths in the low-injection regime. The low-injection regime may be generally defined as a state in which the excess minority carrier density in the specimen is lower than the equilibrium majority carrier density. However, the systems and methods described herein may also be used in other regimes as well. The diffusion length may be determined from a plot of the inverse of the surface photovoltage (1/SPV) vs. the inverse of the absorption coefficient ($1/\alpha$). Such determinations may be used in instances where the SPV is measured with a constant illumination flux incident on the specimen. Alternatively, the diffusion length may be determined from a plot of the flux ($\Phi$) vs. an inverse of the absorption coefficients ($1/\alpha$). Such a plot may be used when a servo circuit is used to adjust one or more parameters of light sources or light beams produced by the light sources (e.g., the laser intensities) to produce substantially the same SPV signals at the two wavelengths. These measurements may be used to determine one or more minority carrier lifetimes of the specimen. The lifetimes are inversely related to the degree of contamination in the specimen (i.e., as the contamination level increases, electron-hole pairs have a greater number of recombination sites, thus their lifetime decreases).

As shown in FIG. 1, the system includes two light sources 10 and 12. In one embodiment, light sources 10 and 12 may include lasers such as diode lasers. In this manner, the system design is much simpler than other systems that are currently available for minority carrier diffusion length measurements. For example, the narrow wavelength bands of the light generated by the diode lasers eliminate the need for monochromators or bandpass filters. However, it is to be understood that the light sources may include any other light sources known in the art. For example, the light sources may include other light sources such as a broadband illumination light source or infrared (IR) light emitting diodes (LEDs) coupled to bandpass filters or a monochromator. Many other such light sources could be used instead of lasers, but the resulting system will be more complicated.

Modulator 14 is coupled to diode lasers 10 and 12. Modulator 14 may modulate both diode lasers by directly modulating drivers (not shown) of the diode lasers. Therefore, by directly modulating the drivers of the diode lasers, a chopper wheel can be eliminated from the system. The modulator is configured to modulate both light sources at substantially the same frequency. The frequency at which the light sources are modulated may vary depending on, for example, the specimen that is being measured. Appropriate frequencies for modulating the light source may be less than about 1 kHz. In some embodiments, an appropriate frequency for modulating the light source may be about 500 Hz. In addition, one of the light sources is modulated 90° out of phase compared to the other light source. For example, light source 12 may be modulated 90° out of phase compared to light source 10 or vice versa. Therefore, the system described herein is advantageous over other currently used systems since the system is designed for simultaneous illumination while having a simpler modulation scheme than those currently used systems. The modulator may include any suitable modulator known in the art.

Light sources 10 and 12 are configured to generate light having different wavelengths. The wavelengths of the light generated by both light sources are preferably shorter than a bandgap of the specimen being measured. In this manner, the wavelengths of the light may vary depending on the specimen that is being measured. For example, if the specimen being measured is a silicon wafer, the wavelengths of the light generated by light sources 10 and 12 may be about 780 nm and about 950 nm. However, the wavelengths of the light may be any wavelengths shorter than the bandgap of silicon. Examples of appropriate wavelengths include wavelengths from about 750 nm to about 1000 nm. Preferably, the wavelengths of the light sources are selected such that the minority carriers generated by illumination extend to different depths beneath an upper surface of the specimen. For example, the different wavelengths are generally single or near single wavelengths that are separated by about 1 nm or more (e.g., by 10 nm, 20 nm, 50 nm, 100 nm, etc.). In addition, the light sources may be configured to generate light having substantially constant illumination fluxes. Furthermore, the flux levels of both light sources may be substantially the same or may be adjusted so that the resulting SPV readings are substantially the same. The flux levels of the light sources may be monitored, altered, and/or controlled using any means known in the art.

Fiber optic bundle 16 may be coupled to light source 10, and fiber optic bundle 18 may be coupled to light source 12. The fiber optic bundles may include any suitable fiber optic bundles known in the art. Light from the light sources may be coupled into the respective fiber optic bundles, which may then be coupled into fiber optic bundle 20. In this manner, light from fiber optic bundles 16 and 18 may be coupled into fiber optic bundle 20. Fiber optic bundle 20 may also include any suitable fiber optic bundle known in the art.

Fiber optic bundle 20 is coupled to probe 22. In particular, fiber optic bundle 20 may be coupled to probe 22 such that the light exiting fiber optic bundle 20 can illuminate measurement spot 24 on specimen 26. In this manner, light from light sources 10 and 12 can illuminate measurement spot 24 on specimen 26 substantially simultaneously. In addition, light from light sources 10 and 12 and probe 22 may be directed to the same measurement spot at the same time. In this manner, illumination and measurement may be performed with little or no delay. The system may also include a stage (not shown) upon which the specimen may be disposed during the measurements. The stage may include any appropriate stage known in the art.

The illuminated portion of the specimen at the measurement spot may absorb the light from light sources 10 and 12 and produce excess carriers (holes and electrons) since the energy of the incident photons is above the bandgap of the specimen. As a result of the photogeneration and diffusion process, a certain number of electron-hole pairs will reach the proximity of the surface of the specimen and become separated by the electric field of the surface-space charge region to produce a surface photo voltage (SPV). Different wavelengths of light will generate minority carriers in regions extending to different depths beneath the specimen surface. Probe 22 is configured to measure SPVs of specimen 26 at measurement spot 24. Each SPV is generated by illumination of the specimen with one of the two light sources.

Since the SPV measurements can be performed substantially simultaneously, the systems described herein have high throughput, particularly when compared to other systems known in the art. In addition, since the SPV measurements can be performed substantially simultaneously, the measurements will not be affected by error due to changes in the specimen over time and therefore will be more accurate than measurements performed at different times. Furthermore, since the SPVs are generated with light having different wavelengths and the same modulation, the SPV measurements do not have to be corrected for differences in the modulation. As such, determining properties of the specimen using the SPV measurements as described further herein may be simpler and more accurate than determining the properties using other systems known in the art. In addition, the SPV methods and systems described herein can have precisions of about 2 μm (1 sigma), so it is a higher resolution technique than others known in the art.

In one embodiment, probe 22 may be a Kelvin probe. Such probes are known in the art. Alternatively, probe 22 may be any other probe known in the art that can measure a SPV of a specimen without contacting the specimen. The SPV measurements may be performed in a substantially dark background. For example, a housing (not shown) or another component of the system may be configured to limit light other than that from the light sources from reaching the measurement spot during the SPV measurements. In other embodiments, the SPV measurements may be performed in the presence of white light (not shown). For instance, the white light may be directed to the measurement spot on the specimen along with the light from the light sources. The white light may not be modulated. The white light may be used to saturate traps in the specimen such that minority carriers generated by the light from the light sources cannot migrate into and get stuck in the traps. Examples of systems that are configured to perform SPV measurements in the presence of an unmodulated light source are illustrated in U.S. Pat. No. 6,512,384 to Lagowski et al., which is incorporated by reference as if fully set forth herein. The system shown in FIG. 1 may be further configured as described in this patent.

Output from probe 22 is directed to lock-in amplifier 28. Since both light sources are modulated at the same frequency, the lock-in amplifier may include a standard lock-in amplifier such as those used in the Quantox tools, which are commercially available from KLA-Tencor. Lock-in amplifier 28 is configured to demodulate the ac-SPV signals generated by probe 22 with the in-phase channel containing the signal due to light source 10 and the quadrature channel containing the signal due to light source 12. The lock-in amplifier may include any suitable lock-in amplifier known in the art. Therefore, the system shown in FIG. 1 is simpler than other conventional designs not only since only one modulator can be used to modulate both light sources but also since one lock-in amplifier can be used to demodulate both SPV signals.

The signals from both channels of the lock-in amplifier may be provided to processor 30. Additional electronic components (not shown) may also be included in the system. The additional electronic components may be coupled between probe 22 and lock-in amplifier 28 and/or between lock-in amplifier 28 and processor 30. The additional electronic components may be configured to further process the output from probe 22. The additional electronic components may include any suitable components known in the art.

Measurements of the SPV can be to determine the minority carrier diffusion length as well as the minority carrier lifetime and the concentration of contaminants in the specimen. In one embodiment, processor 30 may be configured to determine a minority carrier diffusion length of the specimen from the two SPV signals in the two channels and absorption coefficients on the specimen at the different wavelengths. The absorption coefficients may be determined using any method known in the art. For example, the absorption coefficients may be predetermined values that are known for the specimen at the different wavelengths. Alternatively, the absorption coefficients may be determined using a quantitative relationship describing the absorption coefficients of the specimen as a function of wavelength.

In one embodiment, the processor may be configured to determine the minority carrier diffusion length by generating a plot of an inverse of the SPV values (1/SPV) measured at the different wavelengths vs. an inverse of the absorption coefficients ($1/\alpha$) at the different wavelengths. The processor may then determine the minority carrier diffusion length from a linear fit to the plot. For example, the minority carrier diffusion length may be determined from the intercept of the linear fit on the x-axis of the plot. In such an embodiment, the light sources are configured to illuminate the specimen with substantially constant illumination flux as described above. In another embodiment, the two light sources may be coupled to a servo circuit that is configured to adjust the laser intensities to result in substantially the same SPV signals at the two wavelengths. The processor may also be configured to generate a plot of flux ($\Phi$) vs. an inverse of the absorption coefficients ($1/\alpha$). In such an embodiment, the processor may also be configured to determine the minority carrier diffusion length from a linear fit to the plot.

In some embodiments, the processor may also be configured to determine contamination levels in the specimen using the minority carrier diffusion length. For example, the minority carrier diffusion length may be used to determine a minority carrier lifetime of the specimen. The minority carrier lifetime may be determined from the minority carrier diffusion length using any algorithm or method known in the art. The minority carrier diffusion length or the minority carrier lifetime may be used to determine contamination levels in the specimen. As described above, the minority carrier lifetime has an inverse relationship to the contamination levels in the specimen. The contamination levels may be determined from the minority carrier diffusion length or lifetime using any algorithm or method known in the art. The contamination may include metal contamination or any other contamination known in the art. The processor may also be configured to perform any other functions that are known in the art.

As shown in FIG. 1, specimen 26 includes dielectric layer 26a formed on substrate 26b. In this manner, the SPV measurements may be performed on dielectric layer 26a to measure the minority carrier lifetimes in the substrate as well as the contamination levels of the substrate. Although only one layer is shown on substrate 26b in FIG. 1, it is to be understood that many layers (patterned and/or unpatterned, and/or insulating) may be formed on substrate 26b under dielectric layer 26a. Such layers will not alter the measurements described herein. In other embodiments, the SPV measurements may be performed on substrate 26b. In this embodiment, the dielectric layer (and other optional layers) may not be formed on substrate 26b.

Obviously, the system shown in FIG. 1 may have a variety of different configurations. For example, the system may include more than two light sources. Each of the light sources may be configured to illuminate a measurement spot on a specimen substantially simultaneously with a different wavelength of light. Therefore, more than two wavelengths of light may be directed to the measurement spot substantially simultaneously. The light sources may be modulated as described above, and the SPV measurements may be performed as described above. In one particular example, the system may include four light sources, and a four-channel direct digital synthesizer (DDS) may be used to modulate light from each of the light sources at the same frequency with fixed phase relationships to each other. In this manner, the minority carrier diffusion length may be determined from a greater number of data points thereby potentially increasing the accuracy of the diffusion length measurement as well as the accuracy of the contamination values determined from the diffusion length.

In another example, the fiber optic bundles may not be included in the system. In such an example, the light may be directed to the specimen using any other means known in the art (e.g., lenses, mirrors, beamsplitters, etc.). In addition, the system shown in FIG. 1 may include additional components (not shown) that may be used to perform additional measurements of the specimen. For example, the system may include a charge deposition system such as a corona source and/or other components that can be used to perform other non-contact measurements of the system. Examples of additional components that may be included in the system shown in FIG. 1 are illustrated in U.S. patent application Ser. No. 10/616,086 entitled "Methods and Systems for Determining a Property of an Insulating Film," filed Jul. 9, 2003 by Miller et al. and Ser. No. 10/701,112 entitled "Contactless Charge Measurement of Product Wafers and Control of Corona Generation and Deposition," filed Nov. 4, 2003 by Samsavar et al., which are incorporated by reference as if fully set forth herein. The system shown in FIG. 1 may be further configured as described in these patent applications.

In an additional example, although the system has been described above with respect to one measurement spot, the system may be configured to perform the measurements at multiple measurements spots on the specimen. For example, the system may be configured to move the specimen relative to the probe (e.g., by controlling the stage) and/or the system may be configured to move the probe relative to the specimen (e.g., by controlling the probe). In this manner, the measurements may be performed at various locations on the specimen. As a result, the properties of the specimen (minority carrier diffusion length, minority carrier lifetime, and contamination levels) may be determined at various locations on the specimen, and the variation in the properties across the specimen may be determined.

In addition, since other properties of the specimen or measurement parameters (e.g., reflectance of the light from the upper surface of the specimen, temperature, etc.), which may affect the measurements, may vary from location to location on the specimen, the systems may be configured to measure other properties of the specimen or parameters of the measurement process at each location and to correct the measurements at the various locations using these other properties. These other properties may be measured using any means known in the art. Examples of methods that can be used to correct SPV measurements for reflectance and temperature variations are illustrated in U.S. Pat. No. 5,663,657 to Lagowski et al., which is incorporated by reference as if fully set forth herein. The system shown in FIG. 1 may be further configured as described in this patent.

Figure 2:
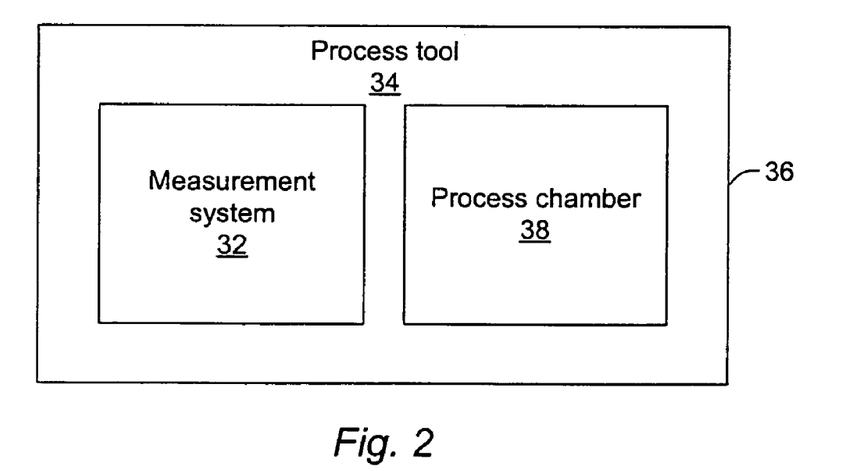
FIG. 2 is a schematic diagram illustrating one embodiment of the system of FIG. 1 coupled to a process tool.

In some embodiments, the system shown in FIG. 1 may also be coupled to a process tool. For example, as shown in the embodiment of FIG. 2, measurement system 32, which may be configured as described above, is disposed within process tool 34. In particular, measurement system 32 may be disposed within housing 36 of process tool 34. Process tool 34 includes process chamber 38. Although process tool 34 is shown to include one process chamber, it is to be understood that process tool 34 may include more than one process chamber, each of which may be configured similarly or differently. For example, different steps of a process carried out by the process tool may be performed in different process chambers.

Measurement system 32 may be configured to perform the measurements described above during a process carried out by process tool 34. For example, in the embodiment shown in FIG. 2, measurement system 32 may be configured to perform the measurements before or after a specimen is processed by process chamber 38. In such embodiments, the measurement system may be coupled to the process chamber by a common specimen handler (not shown). In another embodiment, the measurement system may be coupled to the process chamber such that the measurements may be performed during a process step carried out in the process chamber. For example, in one such embodiment, the measurement system may be disposed within the process chamber. In this manner, the measurement system and the process chamber may be coupled to a common stage (not shown).

The measurement system may be coupled to a process tool in any other manner. For example, the measurement system may be coupled to a process tool by a common processor, a common power source, a transmission medium, etc. Additional examples of how the measurement system may be coupled to a process tool are illustrated in U.S. patent application Ser. No. 10/701,112 entitled "Contactless Charge Measurement of Product Wafers and Control of Corona Generation and Deposition," filed Nov. 4, 2003 by Samsavar et al., which is incorporated by reference as if fully set forth herein. The measurement system may be coupled to a process tool as described in this patent application. A process tool as described herein may include, but is not limited to, a deposition tool such as a chemical vapor deposition tool, a physical vapor deposition tool, and an atomic layer deposition tool, an etch tool such as a plasma etch tool, a chemical-mechanical polishing tool, a thermal tool such as a rapid thermal anneal tool and a diffusion furnace, a cleaning tool, an ion implantation tool, and any other semiconductor process tool known in the art.

The system shown in FIG. 2 may also include a processor such as that shown in FIG. 1. The processor may be configured as described above. The processor may also be configured to alter, monitor, and/or control one or more parameters of the process tool using the measurements performed by the measurement system. For example, the processor may be configured to determine if the contamination levels of a specimen are within specifications for the contamination. If they are not, the processor may determine which and how one or more parameters of the process tool may be altered. Particularly, the parameter(s) are preferably altered to reduce the contamination levels of the specimen and to bring the contamination levels back into specifications. In a similar manner, the processor may monitor one or more parameters of the process tool based on contamination level measurements that are performed on specimens that have been processed by the process tool at different times. In some embodiments, the processor may also be configured to determine further processing of the specimen. For example, the processor may determine if fabrication should be performed or continued on a specimen based on the contamination levels. The processor may also determine if the specimen can be reworked to reduce the contamination levels of the specimen. In addition, the processor may determine that the specimen should be scrapped if the contamination levels are too high and cannot be corrected.

Figure 3:
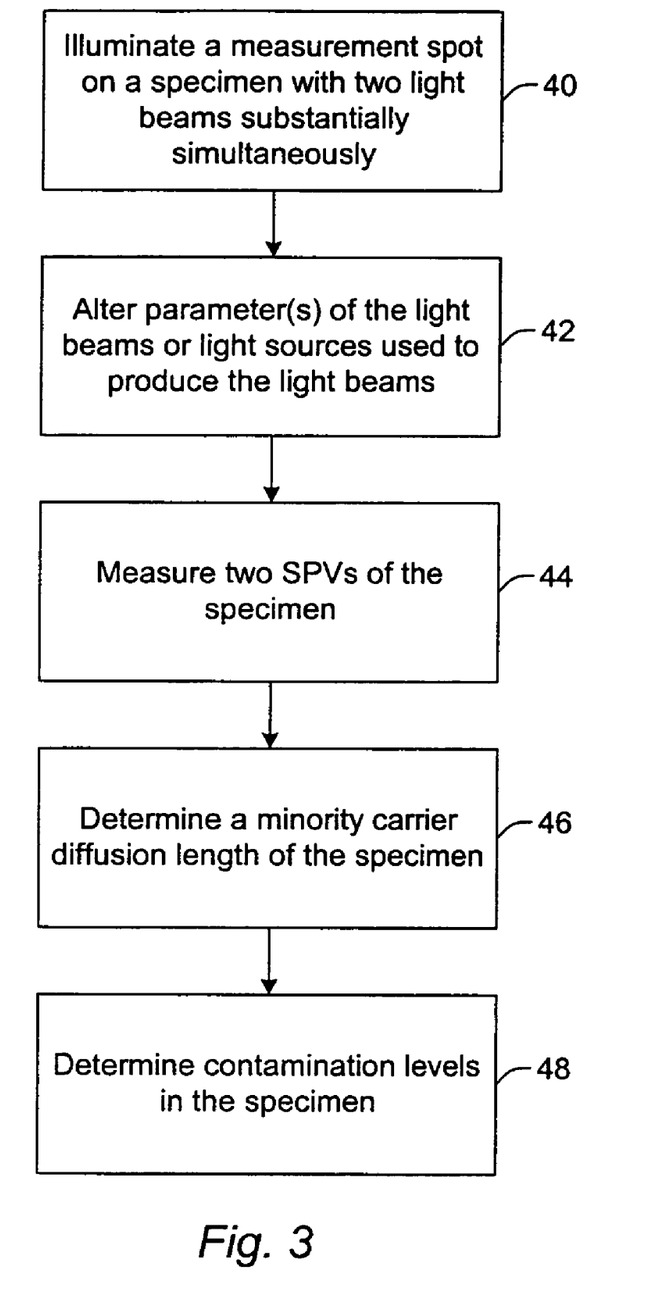
FIG. 3 is a flow chart illustrating one embodiment of a method for determining a property of a specimen.

FIG. 3 illustrates one embodiment of a method for determining a property of a specimen without contacting the specimen. The specimen may be configured as described above. The method includes illuminating a measurement spot on the specimen with two light beams substantially simultaneously, as shown in step 40. The two light beams have different wavelengths and are modulated at substantially the same frequency. The wavelengths of the light beams may be selected as described above. The light beams may be modulated as described above. In addition, a first of the two light beams is modulated 90° out of phase compared to a second of the two light beams.

In some embodiments, the two light beams may have substantially constant illumination fluxes. In one embodiment, the method may include altering one or more parameters of the light beams or light sources used to produce the light beams (e.g., laser intensity), as shown in step 42. In one such embodiment, the parameter(s) of the light beams may be altered to achieve a substantially constant flux for the two light beams. In an alternative embodiment, the parameter(s) of the light beams or light sources used to produce the light beams (e.g., laser intensity) may be altered in step 42 to achieve substantially equal SPV values for both light beams.

The method also includes measuring two SPVs of the specimen, as shown in step 44. Each SPV is generated by illuminating the specimen with one of the two light beams. The SPV measurements may be performed without contacting the specimen (e.g., using a Kelvin probe or another non-contact probe). In some embodiments, the method may include illuminating the measurement spot on the specimen with more than two light beams. The more than two light beams may be configured as described above (e.g., different wavelengths, substantially the same modulation, etc.). In such embodiments, the method may include measuring more than two SPVs of the specimen.

In some embodiments, the method may include generating a plot of an inverse of the two (or more) SPV values vs. an inverse of the absorption coefficients of the specimen at the different wavelengths. The absorption coefficients may be determined as described above. Alternatively, the method may include generating a plot of flux ($\Phi$) vs. an inverse of the absorption coefficients ($1/\alpha$) at the different wavelengths. Such a plot may be useful when flux is measured for substantially the same SPV signals at the two wavelengths. The method also includes determining a minority carrier diffusion length of the specimen, as shown in step 46. The minority carrier diffusion length of the specimen may be determined as described above. For example, the minority carrier diffusion length may be determined from a linear fit to a plot that has been generated as described above. In addition, the method may include determining contamination levels in the specimen, as shown in optional step 48. For example, the minority carrier diffusion length may be used to determine a minority carrier lifetime. The contamination levels may be determined from the minority carrier diffusion length or lifetime using any algorithm or method known in the art. The contamination may include metal contamination or any other contamination known in the art. The method shown in FIG. 3 may include any other steps described herein. For example, the method may include altering, monitoring, and/or controlling one or more parameters of a process tool as described above.

Additional embodiments described herein relate to inspection of a specimen, particularly for electrical defects (and optionally other defects). The embodiments described herein have several advantages over other methods and systems known in the art for electrical defect inspection. For example, the methods and systems described herein can be used to inspect a specimen in an ambient environment. In particular, the systems described herein use a corona charge deposition subsystem instead of an e-beam system. Therefore, inspection can be performed in an ambient environment. As such, the methods and systems described herein may be less expensive and may have a higher throughput than other electrical defect inspection methods and systems. In addition, the methods and systems described herein can be used to inspect a specimen using different types of charges (negative and/or positive) to detect electrical defects on the specimen. In particular, a corona-based charge deposition subsystem may readily generate both negative and positive charges. In this manner, the methods and systems described herein may be used to generate more information about the specimen than other electrical defect inspection methods and systems, which can be advantageously used for more accurate defect inspection and classification. For example, measurements of both negative and positive wafer maps may allow enhanced identification of defect types. Additional advantages of the systems and methods described herein will become apparent upon further reading of the description provided herein.

Figure 4:
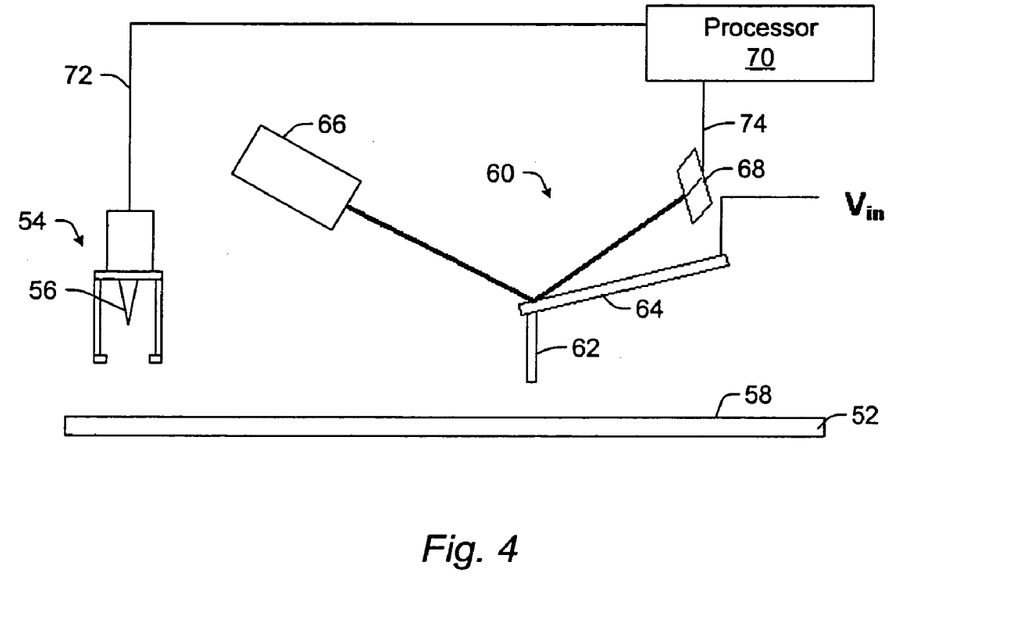
FIG. 4 is a schematic diagram illustrating a side view of one embodiment of a system configured to detect defects on a specimen.

FIG. 4 illustrates one embodiment of a system configured to detect defects on a specimen. In one embodiment, specimen 52 may be a patterned wafer. However, the specimen may include any of those specimens described herein (e.g., an unpatterned wafer). The defects that are detected on the specimen may include electrical defects since the systems and methods described herein may be particularly useful for the detection of electrical defects. For example, the systems and methods described herein may be particularly advantageous for the inspection of specimens having conductive structures formed thereon and specimens that may have metal contamination. In another example, the systems and methods described herein may be particularly useful for detecting metal wiring connectivity defects on patterned wafers using surface voltage measurements as described further herein. In addition, the systems and methods described herein may be used to detect via resistivity variations due to, for example, electrically disconnected vias. In another example, the methods and systems described herein may be used to detect dielectric film leakage differences at different integration locations and/or structures. In a different example, the systems and methods described herein may be used to detect surface conductivity of dielectric films (such as diffusion barrier or etch stop films) due to, for example, metal contaminants or CMP residuals present on the dielectric film. However, as described further herein, the system may also be used to detect other defects on the specimen.

The system includes charge deposition subsystem 54. Charge deposition subsystem 54 may be configured as a corona gun. A high voltage supply (not shown) may be coupled to the corona gun. The voltage supply may be configured to supply high voltage (i.e., about 6 kV to about 12 kV) to the corona gun to produce positive or negative corona charges depending on the polarity of the voltage supply. The corona gun may include one or more needles 56 coupled to the high voltage supply. Although one particular configuration of the charge deposition subsystem is shown in FIG. 4, it is to be understood that the charge deposition subsystem may have any configuration known in the art. For example, charge deposition subsystem 54 may include a downstream radio frequency (RF) or microwave corona system with a ceramic plasma container (without metal electrodes exposed to the plasma) to minimize metal contamination of the specimen. Additional examples of appropriate configurations for the charge deposition subsystem are illustrated in U.S. patent application Ser. No. 10/616,086 entitled "Methods and Systems for Determining a Property of an Insulating Film," filed Jul. 9, 2003 by Miller et al. and Ser. No. 10/701,112 entitled "Contactless Charge Measurement of Product Wafers and Control of Corona Generation and Deposition," filed Nov. 4, 2003 by Samsavar et al., which are incorporated by reference as if fully set forth herein. The system shown in FIG. 4 may be further configured as described in these patent applications. In another example, the charge deposition subsystem may include a controlled gas plasma system that uses, for example, inner gas or pure nitrogen ($N_2$) gas.

Figure 5:
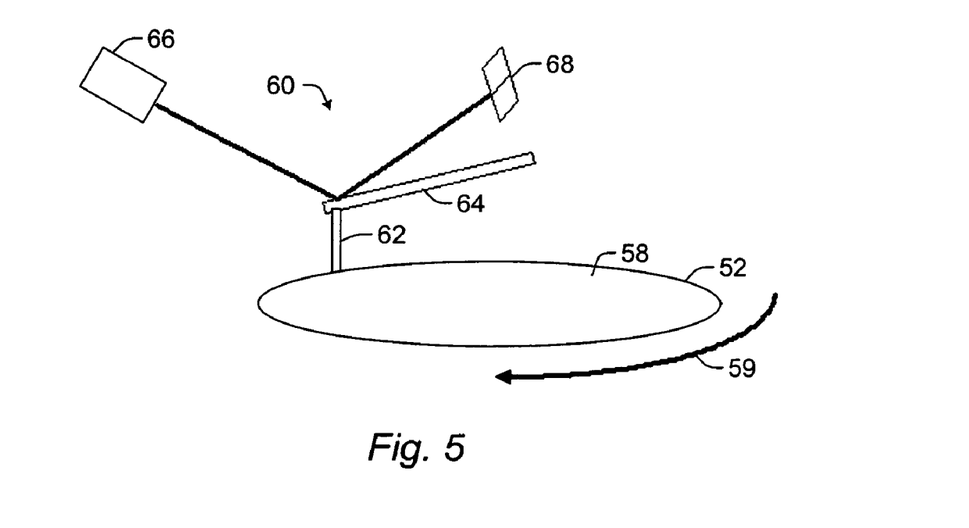
FIG. 5 is a schematic diagram illustrating a perspective view of a portion of the system of FIG. 4.

Charge deposition subsystem 54 is configured to deposit a charge (not shown) at multiple locations on upper surface 58 of specimen 52. For example, the charge deposition subsystem may be coupled to one or more components (not shown) that may be configured to move the charge deposition subsystem with respect to the specimen such that a charge may be deposited at multiple locations on the specimen. In addition, the specimen may be disposed upon a stage (not shown) during inspection. The stage may be configured to move the specimen with respect to the charge deposition subsystem such that the charge may be deposited at multiple locations on the specimen. The stage may include any appropriate stage known in the art, some examples of which are described in the above-referenced patent applications. In some embodiments, the stage and/or the charge deposition subsystem may be configured to rotate such that the charge deposition subsystem can scan the specimen in direction 59 as shown in FIG. 5. Alternatively, the stage and/or charge deposition subsystem may be configured to move such that the charge deposition subsystem can scan the specimen in other directions (not shown) such as in the x and y directions.

In some embodiments, the multiple locations on which a charge is deposited may span substantially an entire surface of the specimen. Alternatively, the multiple locations on which the charge is deposited may span only a portion of the surface of the specimen. The number, spacing, and area of the multiple locations on which a charge is deposited may vary depending on, for example, the specimen and/or the inspection being performed. For example, in some embodiments, it may be desirable to inspect substantially an entire surface of the specimen. Alternatively, it may be desirable to inspect only a portion of the surface of the specimen.

The charge that is deposited on upper surface 58 of specimen 52 may be a positive charge or a negative charge. The charge that is deposited may vary depending on, for example, the specimen and/or the type of inspection that is being performed. For example, a positive charge may be advantageous for detecting defects of one type, while a negative charge may be advantageous for detecting defects of another type. In addition, one charge deposition may be performed using one type of charge. After other steps described herein have been performed (e.g., probe vibration measurements), the process may be repeated by depositing a different type of charge on the specimen as will be described further herein.

The system also includes measurement subsystem 60. Measurement subsystem 60 is configured to measure a vibration of probe 62 at a location on the specimen after the charge has been deposited at the location by charge deposition subsystem 54. In some embodiments, measurement subsystem 60 may also be used to measure a vibration of probe 62 at locations on the specimen before the charge has been deposited on the specimen. Probe 62 may be a Kelvin probe. Such a probe may be particularly attractive since it can be used for relatively high speed data acquisition. However, the probe may include any appropriate probe known in the art that will vibrate in response to a charge deposited on a specimen without contacting the specimen.

Probe 62 preferably has a relatively small tip size. In particular, the probe preferably has a tip size that is smaller than electrical structures formed on the specimen (i.e., less than a device feature size). Therefore, the tip size of the probe may vary depending on the characteristics of the specimen and the characteristics of structures formed on the specimen. In general, the probe may have a tip size on the order of microns or nanometers. In some embodiments, the probe may have a tip size of about 10 µm to about 1 nm. In this manner, the probe has a relatively fine resolution.

The probe may be similar in some respects to probes that are used for atomic force microscopy (AFM) and/or microwave probes. Many AFM probes are known in the art and commercially available. Microwave probes are also known in the art and many different types of microwave probes are commercially available. Examples of microwave probes are illustrated in U.S. Pat. No. 6,366,104 to Heal et al., U.S. Pat. No. 6,531,774 to Do et al., U.S. Pat. No. 6,538,454 to Frenkel et al., U.S. Pat. No. 6,563,299 to Van Horn et al., and U.S. Pat. No. 6,614,227 to Ookubo, which are incorporated by reference as if fully set forth herein. The probe may be further configured as described in these patents. Examples of microwave probes that are commercially available include the Picoprobe Models that are produced by GGB Industries, Inc., Naples, Fla. However, the probe may be configured similarly to any microwave probe known in the art. In addition, the frequency of the probe used herein may be higher than those used for AFM technology. For example, the frequency of the probe used in the systems described herein may be on the order of GHz.

Probe 62 is coupled to cantilever 64. The cantilever may be configured such that it can vibrate in conjunction with vibration of the probe. An ac voltage, $V_{in} = a \sin(\omega t)$, is applied to the probe, as shown in FIG. 4. The measurement subsystem is configured to measure vibration of the cantilever, and thus vibration of the probe, by optically measuring a position of the cantilever. For example, measurement subsystem 60 includes light source 66. The light source is configured to illuminate an upper surface of cantilever 64, as shown in FIG. 4. In some embodiments, light source 66 may be a laser. However, light source 66 may include any appropriate light source known in the art. Light reflected from cantilever 64 may be detected by detector 68. Detector 68 may be a position sensitive detector. An appropriate detector may include, but is not limited to, a Quad detector and a piezo-resistive element. Many such detectors are known in the art, and detector 68 may include any suitable position sensitive detector. A signal generated by the detector will also be a function of the position of the cantilever. In this manner, a signal generated by the detector will be a function of the vibration of probe 62. As such, the measurement subsystem can measure the vibration of the probe. The measurement subsystem may be further configured as described in U.S. patent application Ser. No. 10/701,112 entitled "Contactless Charge Measurement of Product Wafers and Control of Corona Generation and Deposition," filed Nov. 4, 2003 by Samsavar et al., which is incorporated by reference as if fully set forth herein.

Measurement subsystem 60 may also be configured to measure the vibration of probe 62 at multiple locations on the specimen upon which a charge has been deposited by charge deposition subsystem 54. For example, the system may be coupled to one or more components (not shown) that may be configured to move the measurement subsystem with respect to the specimen such that measurements can be performed at multiple locations on the specimen. Alternatively, the specimen may be disposed upon a stage (not shown) during inspection. The stage may be configured to move the specimen with respect to the measurement subsystem such that the vibration of the probe can be measured at multiple locations on the specimen. The stage may be configured as described above. For example, as described above, the stage and/or the measurement subsystem may be configured to rotate such that the measurement subsystem can scan the specimen in direction 59 as shown in FIG. 5. Alternatively, the stage and/or measurement subsystem may be configured to move such that the measurement subsystem can scan the specimen in other directions (not shown) such as in the x and y directions.

The multiple locations at which the vibration of the probe is measured may span substantially an entire surface of the specimen or only a portion of the surface of the specimen as described above. In particular, the locations at which the vibration of the probe is measured will vary depending on the locations at which a charge is deposited by the charge deposition subsystem. In one embodiment, the system may be configured to control the charge deposition subsystem and the measurement subsystem such that after a charge has been deposited on one location on the specimen, that location is then measured by the measurement subsystem. In one such embodiment, the charge deposition subsystem and the measurement subsystem may be mounted within a measurement head (not shown) such that the subsystems have a fixed spatial relationship with respect to one another. In this manner, the measurement head may be scanned over the specimen with the measurement subsystem essentially "following" the charge deposition subsystem in a fixed manner. In another such embodiment, the subsystems may be mounted in separate measurement heads, which may be independently controlled such that the measurement subsystem may "follow" the charge deposition subsystem as it scans the specimen. In any of the above embodiments, the measurement subsystem may be configured to measure the vibration at one of the multiple locations while the charge deposition subsystem is depositing a charge at another of the multiple locations. In alternative embodiments, the measurement subsystem may not perform the probe vibration measurements until the charge has been deposited upon all of the locations on the specimen that are to be inspected.

The vibration of probe 62 will be a function of the surface voltage at the location on the specimen above which the probe is disposed. For example, the following expression describes the functional relationship between the probe vibration, z(t), and the surface voltage, $V_s$:

$$z(t) \propto \frac{dC}{dz}(V_{tip} - V_s)a\sin(\omega t) \propto (V_{tip} - V_s)\sin(\omega t)$$

where $V_{tip}$ is the voltage supplied to the probe. Therefore, the signals generated by the detector may be used to determine the surface voltage at the location on the specimen.

In one embodiment, the signals generated by detector 68 may be provided to processor 70. The processor may be any suitable processor known in the art. The processor is configured to use the probe vibration signals generated by detector 68 to determine a surface voltage of the specimen at the location(s) at which the probe vibration measurements were performed. The processor may use the equation shown above to determine the surface voltage of the specimen from the probe vibration measurements. However, the processor may be configured to use any equation, algorithm, method, or means known in the art to determine the surface voltage of the specimen.

The processor may also be configured to generate a two-dimensional map (not shown) of the specimen using the surface voltages determined at multiple locations on the specimen. For example, the system may be configured to record the locations on the specimen at which a charge was deposited, and therefore the locations at which the probe vibration measurements were performed. The locations may be recorded in positional coordinates or using any means known in the art for distinguishing one location on a specimen from another. The positional information may be recorded during inspection using any means known in the art. The processor may then use the positional information about the measurement locations on the specimen to arrange the surface voltage values into a two-dimensional map. The two-dimensional map may illustrate surface voltage measurements across substantially an entire upper surface of the specimen or across only a portion of the upper surface of specimen. The processor may use any method, algorithm, or means known in the art to arrange the surface voltage values into a two-dimensional map.

Processor 70 may be further configured to detect defects on the specimen using the two-dimensional map. Processor 70 may also be configured to detect defects on the specimen using the two-dimensional map in combination with any algorithm or method known in the art. For example, the processor may be configured to detect defects by comparing one portion of the two-dimensional map that corresponds to one die on the specimen to another portion of the two-dimensional map that corresponds to a different die on the specimen. Such a defect detection method is commonly referred to as "die-to-die detection."

In another example, the processor may be configured to detect defects by comparing at least a portion of the two-dimensional map to expected results for the portion of the two-dimensional map. In one such embodiment, if the specimen includes a dielectric layer formed on a substrate that is being inspected for metal contamination, a thresholding algorithm may be used to compare data points in the two-dimensional map to a threshold that delineates values of the data points that are non-defective from those that are defective. In this manner, the processor may use the thresholding algorithm to identify those data points in the two-dimensional map that exceed the threshold. The processor may then indicate that those data points exceeding the threshold may correspond to defects. The processor may also record the locations in the two-dimensional map that correspond to potential defects.

In another such embodiment, the specimen may include a patterned wafer having conductive structures formed thereon. A reference two-dimensional map of the specimen may be used to illustrate the expected characteristics (e.g., dimensions, shape, locations, etc.) of the conductive structures. The reference two-dimensional map may be generated using any method known in the art. In another example, a two-dimensional map generated using measurements performed on the specimen prior to deposition of the charge may be used as the reference map. The processor may compare the two-dimensional map generated using the surface voltage measurements to the reference two-dimensional map. The processor may determine that data points in the two-dimensional map that are different than the data points at corresponding locations in the reference two-dimensional map may correspond to defects. In addition, as described above, the processor may record the locations in the two-dimensional map that correspond to potential defects. The processor may also use any another method, algorithm, or means known in the art for detecting defects in the two-dimensional map. The processor may also be configured to perform additional functions on the probe vibration measurements (e.g., clustering defective data points, etc.).

In the embodiments described above, the system is used to generate one two-dimensional map using one type of charge deposition. However, it is to be understood that the system may be configured to generate two different two-dimensional maps, each generated by depositing different types of charges on the specimen. For example, the charge deposition subsystem may be configured to deposit a first type of charge on the specimen. After deposition of the charge, the probe vibration measurements may be performed as described above, and a two-dimensional map may be generated from surface voltage values determined from the probe vibration measurements. A second type of charge may then be deposited on the specimen at multiple locations such that another two-dimensional map of the specimen can be generated. In particular, the second type of charge may be deposited on the specimen after the first set of probe vibration measurements have been performed. The first type of charge may be a positive charge, and the second type of charge may be a negative charge or vice versa. Both of the two-dimensional maps may be used to detect defects on the specimen.

In one example, a positive charge may be deposited on a specimen such as a wafer. A positive surface voltage map may be generated as described above. Then, a negative charge may be deposited on the wafer to both erase the positive charge that was deposited as well as to create a negative charge condition on the wafer. A negative surface voltage map may be generated as described above. The absolute forms of both maps may be added or one of the two maps may be used separately. The combined or individual surface voltage map(s) may be converted into gray scales. The gray scale map(s) can be used for defect detection and classification.

In another example, the charge deposition subsystem and the measurement subsystem probe may be aligned in one direction such as the x direction. A positive surface voltage map may be measured as described above while the charge deposition subsystem is depositing the charge on the specimen. Since the charge measurement subsystem and the probe are separated laterally in space, a point on the specimen is effectively measured right after a charge has been deposited on that point. These steps may be repeated for a negative charge. The absolute values of both maps may be added or each of the maps may be used independently. The voltage map(s) may be converted into gray scales. The gray scale map(s) can be used for defect detection and classification.

Using both maps for defect detection may be advantageous since defects identified on one of the two-dimensional maps may be confirmed by detection of the same defects on the other of the two-dimensional maps. In addition, some types of defects may be more detectable when one type of charge is deposited on the specimen, and other types of defects may be more detectable when another type of charge is deposited on the specimen. In this manner, using more than one two-dimensional map generated by depositing different types of charges on the specimen may allow more accurate defect detection.

The system as described above, therefore, is configured for defect detection on a specimen. The system may also be used to perform additional defect-related functions or measurements. For example, in one embodiment, probe 62 may be an "inspection probe." In other words, the probe may have one or more characteristics that make it suitable for inspection purposes. For example, the probe may have a tip size that is suitable for inspection of a specimen. The tip size of the probe may be, as described above, about 10 μm to about 1 nm. Although such a tip size may be suitable for defect inspection, such a tip size may not be particularly suitable for defect review. Therefore, the system may include a review probe (not shown) that has a tip size that is suitable for defect review. In particular, the review probe may have a tip size that is smaller than the tip size of the inspection probe. For example, the review probe may have a tip size that is less than about 10 μm. In this manner, the review probe may be configured to generate more information or more sensitive information about a location on the specimen at which a defect has been detected.

In one such embodiment, the review probe may be coupled to the same measurement subsystem as the inspection probe. For example, the measurement subsystem may include a review probe that is coupled to its own cantilever with an additional optical subsystem coupled to the review cantilever for measuring a vibration of the review probe. The review probe, the cantilever, and the optical subsystem may have a configuration similar to that shown in FIG. 4 and as described further above. In this manner, the review probe may be operated in a manner similar to the operation of the inspection probe although the review probe has a higher resolution than the inspection probe. In a different embodiment, the system may include two different measurement subsystems, one for inspection and one for review. The measurement subsystem for inspection may be configured as shown in FIG. 4. The measurement subsystem for review may also be configured as shown in FIG. 4, but instead of an inspection probe, the review measurement subsystem may include a review probe.

The system may also be configured to classify the defects that are detected on the specimen. For example, the processor may use characteristics of the two-dimensional map, characteristics of the individual locations of the two-dimensional maps at which defects were detected, characteristics of the data points at the individual defective locations, characteristics of the specimen, and/or any other information about the specimen that is available to determine what type of defects have been detected. The processor may use any classification method, algorithm, and/or means known in the art to classify the defects. In addition, the processor may use data points that were measured after different types of charges were deposited on the specimen and/or different two-dimensional maps that were generated using different types of charges to determine the classification of defects. The additional information about the defects and the specimen provided by the measurements after different types of charge depositions may improve the accuracy of the defect classification.

In addition, the processor may be configured to perform additional functions. For example, the processor may be configured to control the operation of charge deposition subsystem 54 during an inspection. In one such example, processor 70 may be coupled to charge deposition subsystem 54 by transmission medium 72. The transmission medium may include any transmission medium known in the art and may include "wired" and "wireless" portions. The processor may be configured to control various functions of the charge deposition subsystem such as the amount of the charge that is deposited, the type of charge that is deposited, and/or the location at which the charge is deposited. In some embodiments, the processor may be configured to receive data from the charge deposition subsystem. For example, the processor may be configured to receive charge deposition rates and/or other parameters of the charge deposition from the charge deposition subsystem. The processor may use this data about the charge deposition in conjunction with the two-dimensional map for defect detection. In addition, the processor may use the charge deposition data to detect other defects on the specimen or to determine one or more characteristics of the specimen.

In a similar manner, processor 70 may be coupled to detector 68 of measurement subsystem 60 (and optionally additional components of the measurement subsystem) by transmission medium 74. Transmission medium 74 may be configured as described above. The processor may be configured to receive data from detector 68 as described above. The processor may also be configured to control the operation of the measurement subsystem in a manner similar to that described above. For example, the processor may be configured to control various functions of the measurement subsystem such as the locations at which the measurements are performed, the number of measurements performed at each locations, etc.

As described above, the system may include one measurement subsystem that is used for inspection. As further described above, the measurement subsystem includes one inspection probe that can be arranged above one location on the specimen at a time. The measurement subsystem measures the vibration of the probe at the locations above which the probe is arranged. In additional embodiments, the measurement subsystem may include more than one probe. For example, the probe portion of the measurement subsystem may actually include one or more probes. Multiple probes may be arranged in an array (e.g., a one-dimensional array or a two-dimensional array). The probes may be arranged in an array such that they can be arranged above a plurality of locations on the specimen substantially simultaneously. The measurement subsystem may also be configured to measure a vibration of two or more of the multiple probes substantially simultaneously. In this manner, inspection of a plurality of locations on the specimen may be performed substantially simultaneously. In addition, since the probes have a relatively small tip size, multiple probes may be arranged into an integrated detection array block that has relatively high resolution (e.g., a relatively large number of probes per area on the specimen).

Figure 6:
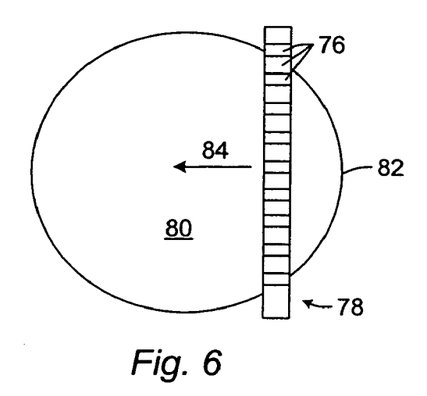
FIG. 6 is a schematic diagram illustrating a top view of another embodiment of a system configured to detect defects on a specimen.

One such embodiment is illustrated in FIG. 6. As shown in FIG. 6, multiple probes 76 are arranged in linear array 78. In this manner, a plurality of probes 76 can be arranged above a plurality of locations on the specimen substantially simultaneously. As shown in FIG. 6, not all of the probes may be arranged above the specimen at the same time. Therefore, only the probes in the array that are arranged above the specimen may be used for measurements at one time. Alternatively, the probes may be arranged in an array such that all of the probes may be arranged above the specimen at the same time. In this manner, all of the probes in the array may be used for measurements at the same time. In another example, the probes may be arranged in an array that has an area that is less than an area of upper surface 80 of specimen 82, as shown in FIG. 6. In this manner, to inspect substantially an entire area of upper surface 80, the array may be moved in direction 84 such that the array of probes can scan over the surface of the specimen. In addition, or alternatively, the specimen may be moved in a direction substantially opposite to direction 84. The array of probes and/or the specimen may be moved as described further above. In a different example, the probes may be arranged in an array that has an area that is approximately equal to an area of upper surface 80 of specimen 82. In this manner, the array of probes may all be arranged above substantially an entire surface of the specimen at one time. As such, the array of probes may perform measurements that span substantially the entire surface area of the specimen substantially simultaneously.

Using multiple probes to inspect a plurality of locations on a specimen at substantially the same time may increase the throughput of the inspection system dramatically. When using multiple probes to inspect a plurality of locations on a specimen at substantially the same time, a charge may be deposited on the plurality of locations on the specimen at substantially the same time. For example, the charge deposition subsystem described above may be modified such that a charge may be deposited across a plurality of locations on the specimen substantially simultaneously. The area of the specimen on which the charge is deposited may be approximately equal to the area of the plurality of locations that can be inspected at substantially the same time. For example, in the embodiment shown in FIG. 6, the charge deposition subsystem may be configured to deposit a charge in a plurality of locations on the specimen in front of linear array 78 substantially simultaneously. The plurality of locations on which the charge is deposited preferably corresponds to the plurality of locations that will be inspected by multiple probes 76 of linear array 78. In this manner, the time between deposition and inspection will be approximately the same at each of the plurality of locations, which will increase the accuracy of the inspection. The systems shown in FIGS. 4–6 may be further configured as described herein. For example, the systems may be coupled to a process tool as described further above. In addition, the systems shown in FIGS. 4–6 and described further above may be integrated in another non-contact measurement system such as the Quantox measurement systems that are commercially available from KLA-Tencor.

Figure 7:
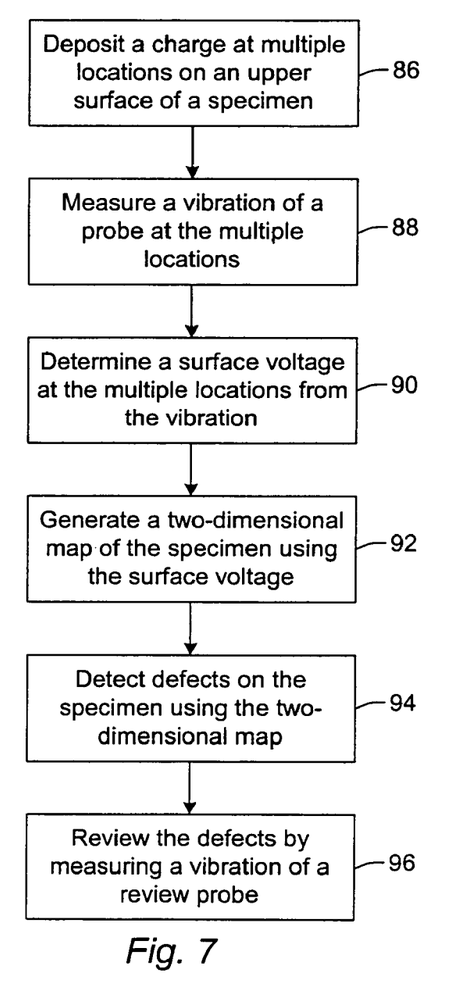
FIG. 7 is a flow chart illustrating one embodiment of a method for detecting defects on a specimen.

FIG. 7 illustrates one embodiment of a method for detecting defects on a specimen. The method may be performed by one of the systems described herein. The specimen may include a patterned wafer or any other specimen described herein. The defects may be electrical defects. However, the method may also include detecting other non-electrical defects on the specimen. The method includes depositing a charge at multiple locations on an upper surface of a specimen, as shown in step 86. Depositing the charge on the specimen may be performed as described above.

The method also includes measuring a vibration of a probe at the multiple locations after the charge has been deposited, as shown in step 88. The vibration of the probe may be performed as described above. For example, in one embodiment, measuring the vibration of the probe may be performed at one of the multiple locations while a charge is deposited at another of the multiple locations. In addition, as described further above, the probe may include a Kelvin probe or any other suitable probe coupled to a cantilever. Measuring the vibration of the probe may include optically measuring a position of the cantilever. In one embodiment, as described further above, the probe may include multiple probes arranged in an array such that the multiple probes can be arranged above a plurality of the multiple locations substantially simultaneously. In one such embodiment, measuring the vibrations of the probes may include measuring a vibration of two or more of the multiple probes substantially simultaneously.

In addition, the method includes determining a surface voltage at the multiple locations from the vibration measurements, as shown in step 90. The surface voltages may be determined from the vibration measurements as described above. The method further includes generating a two-dimensional map of the specimen using the surface voltages at the multiple locations, as shown in step 92. The two-dimensional map of the specimen may be generated as described above. Furthermore, the method includes detecting defects on the specimen using the two-dimensional map, as shown in step 94. The defects may be detected on the specimen as described above.

In one embodiment, the charge that is deposited on the multiple locations on the specimen in step 86 may be a first type of charge. One embodiment of the method may include depositing a second type of charge at the multiple locations such that an additional two-dimensional map of the specimen can be generated. The second type of charge may be deposited at the multiple locations as described further above. In one such embodiment, the defects may be detected on the specimen using the two-dimensional map and the additional two-dimensional map as described above.

In another embodiment, the probe described above may be an inspection probe. In other words, the probe may be configured specifically for inspection of the specimen. The method may also include reviewing the defects that are detected by measuring a vibration of a review probe at locations of the defects, as shown in step 96. The review probe and the inspection probe may be configured as described above. For example, the review probe may have a tip size that is smaller than a tip size of the inspection probe. Each of the embodiments of the method described above may include any other steps described herein.

Program instructions implementing methods such as those described herein may be transmitted over or stored on a carrier medium. The carrier medium may be a transmission medium such as a wire, cable, or wireless transmission link, or a signal traveling along such a wire, cable, or link. The carrier medium may also be a storage medium such as a read-only memory, a random access memory, a magnetic or optical disk, or a magnetic tape.

In an embodiment, a processor may be configured to execute the program instructions to perform a computer-implemented method according to the above embodiments. The processor may take various forms, including a personal computer system, mainframe computer system, workstation, network appliance, Internet appliance, personal digital assistant ("PDA"), television system or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Further modifications and alternative embodiments of various aspects of the invention may be apparent to those skilled in the art in view of this description. For example, methods and systems for determining one or more properties of a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine a property of a specimen without contacting the specimen, comprising:
    two light sources configured to illuminate a measurement spot on the specimen with different wavelengths of light substantially simultaneously, wherein the two light sources are modulated at substantially the same frequency;
    a probe configured to perform at least two measurements on the specimen, wherein each of the at least two measurements is generated by illumination of the specimen by one of the two light sources; and
    a processor configured to determine a minority carrier diffusion length of the specimen from the at least two measurements and absorption coefficients of the specimen at the different wavelengths.

2. The system of claim 1, wherein a first of the two light sources is further modulated 90° out of phase compared to a second of the two light sources.

3. The system of claim 1, wherein the two light sources comprise diode lasers.

4. The system of claim 1, wherein the two light sources comprise lasers, and wherein the two light sources are further modulated by modulating drivers of the lasers.

5. The system of claim 1, wherein the two light sources are further configured to illuminate the specimen with substantially constant illumination fluxes.

6. The system of claim 1, wherein the at least two measurements comprise two surface photo voltages, and wherein the processor is further configured to generate a plot of an inverse of the two surface photo voltages vs. an inverse of the absorption coefficients and to determine the minority carrier diffusion length from a linear fit to the plot.

7. The system of claim 1, wherein the two light sources are further configured to illuminate the specimen to produce substantially equal surface photo voltages from the specimen.

8. The system of claim 1, wherein the at least two measurements comprise two illumination fluxes, and wherein the processor is further configured to generate a plot of the two illumination fluxes vs. an inverse of the absorption coefficients and to determine the minority carrier diffusion length from a linear fit to the plot.

9. The system of claim 1, wherein the processor is further configured to determine contamination levels in the specimen using the minority carrier diffusion length.

10. The system of claim 1, wherein the system is coupled to a process tool.

11. A method for determining a property of a specimen without contacting the specimen, comprising:
    illuminating a measurement spot on the specimen with two light beams substantially simultaneously, wherein the two light beams have different wavelengths, and wherein the two light beams are modulated at the same frequency;
    performing at least two measurements on the specimen, wherein each of the at least two measurements is generated by illuminating the specimen with one of the two light beams; and
    determining a minority carrier diffusion length of the specimen from the at least two measurements and absorption coefficients of the specimen at the different wavelengths.

12. The method of claim 11, wherein a first of the two light beams is further modulated 90° out of phase compared to a second of the two light beams.

13. The method of claim 11, wherein the two light beams have substantially constant illumination fluxes.

14. The method of claim 11, wherein said determining comprises generating a plot of an inverse of the two surface photo voltages vs. an inverse of the absorption coefficients and determining the minority carrier diffusion length from a linear fit to the plot.

15. The method of claim 11, wherein the two light beams are configured to illuminate the specimen to produce substantially equal surface photo voltages from the specimen.

16. The method of claim 11, wherein the at least two measurements comprise two illumination fluxes, and wherein said determining comprises generating a plot of the two illumination fluxes vs. an inverse of the absorption coefficients and determining the minority carrier diffusion length from a linear fit to the plot.

17. The method of claim 11, further comprising determining contamination levels in the specimen using the minority carrier diffusion length.

* * * * *